United States Patent [19]
Flaim et al.

[11] Patent Number: 5,693,691
[45] Date of Patent: Dec. 2, 1997

[54] THERMOSETTING ANTI-REFLECTIVE COATINGS COMPOSITIONS

[75] Inventors: Tony D. Flaim, St.James; Jim D. Meador, Ballwin; Xie Shao; Terry Lowell Brewer, both of Rolla, all of Mo.

[73] Assignee: Brewer Science, Inc., Rolla, Mo.

[21] Appl. No.: 517,089

[22] Filed: Aug. 21, 1995

[51] Int. Cl.[6] .................. C08L 63/00; C08L 61/20; C08F 283/10; C08K 5/04

[52] U.S. Cl. .................. 523/436; 522/904; 525/510; 525/514; 525/523; 525/533; 524/284; 524/360; 524/366; 524/379; 430/270.1; 430/271.1

[58] Field of Search .................. 523/436; 525/510, 525/514, 523, 533; 522/904; 524/284, 360, 366, 379; 430/270.1, 271.1

[56] References Cited

U.S. PATENT DOCUMENTS

| | | | |
|---|---|---|---|
| 3,624,013 | 11/1971 | Sekmakas et al. | 524/539 |
| 3,956,043 | 5/1976 | Zahir et al. | 522/904 |
| 4,316,940 | 2/1982 | Thornley | 525/438 |
| 4,508,724 | 4/1985 | Taylor, Jr. et al. | 514/317 |
| 4,544,691 | 10/1985 | Dexter et al. | 524/99 |
| 4,657,842 | 4/1987 | Finter et al. | 522/904 |
| 5,482,817 | 1/1996 | Dichiara et al. | 522/904 |

FOREIGN PATENT DOCUMENTS 636941  2/1995  European Pat. Off. .

OTHER PUBLICATIONS

Lee et al., "Handbook of Epoxy Resins", McGraw–Hill Book Co., pp. 10/14–15 (1982 Reissue).

*Primary Examiner*—D. R. Wilson
*Attorney, Agent, or Firm*—Veo Peoples, Jr.; Peoples & Hale

[57] ABSTRACT

A thermosetting anti-reflective coating and method for making and using the same is disclosed for a broad range of exposure wavelengths, said coating containing an active curing catalyst, ether or ester linkages derived from epoxy functionality greater than 3.0, a dye-grafted hydroxyl-functional oligomer, and an alkylated aminoplast crosslinking agent, all present in a low-to-medium alcohol-containing solvent.

22 Claims, 4 Drawing Sheets

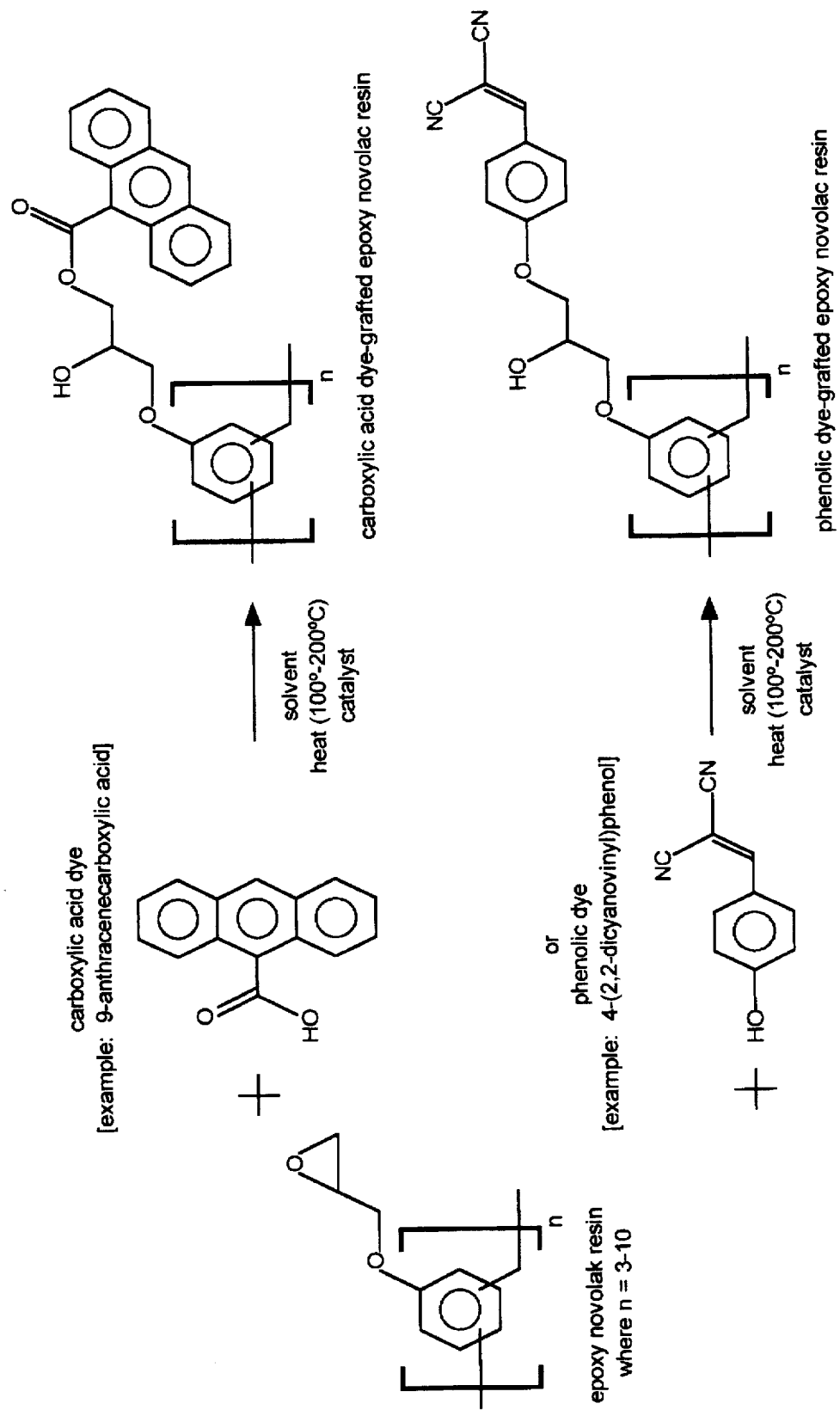
Figure 1. Reaction Scheme for Preparing Dye-Grafted Hydroxyl-Functional Oligomer Starting from Epoxy Novolac Resin

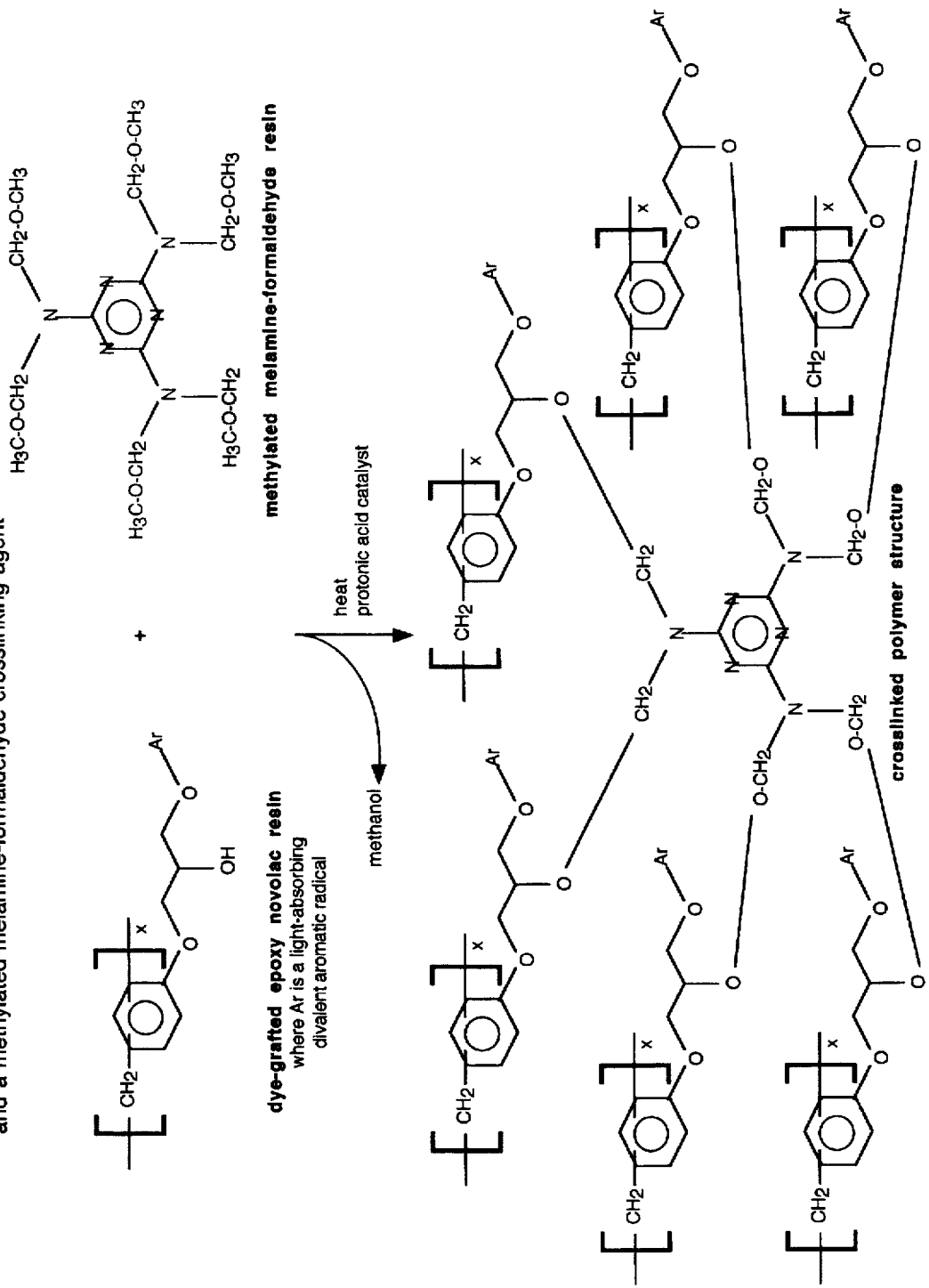
Figure 2. Curing scheme for an anti-reflective coating comprising a dye-grafted hydroxyl-functional oligomer and a methylated melamine-formaldehyde crosslinking agent

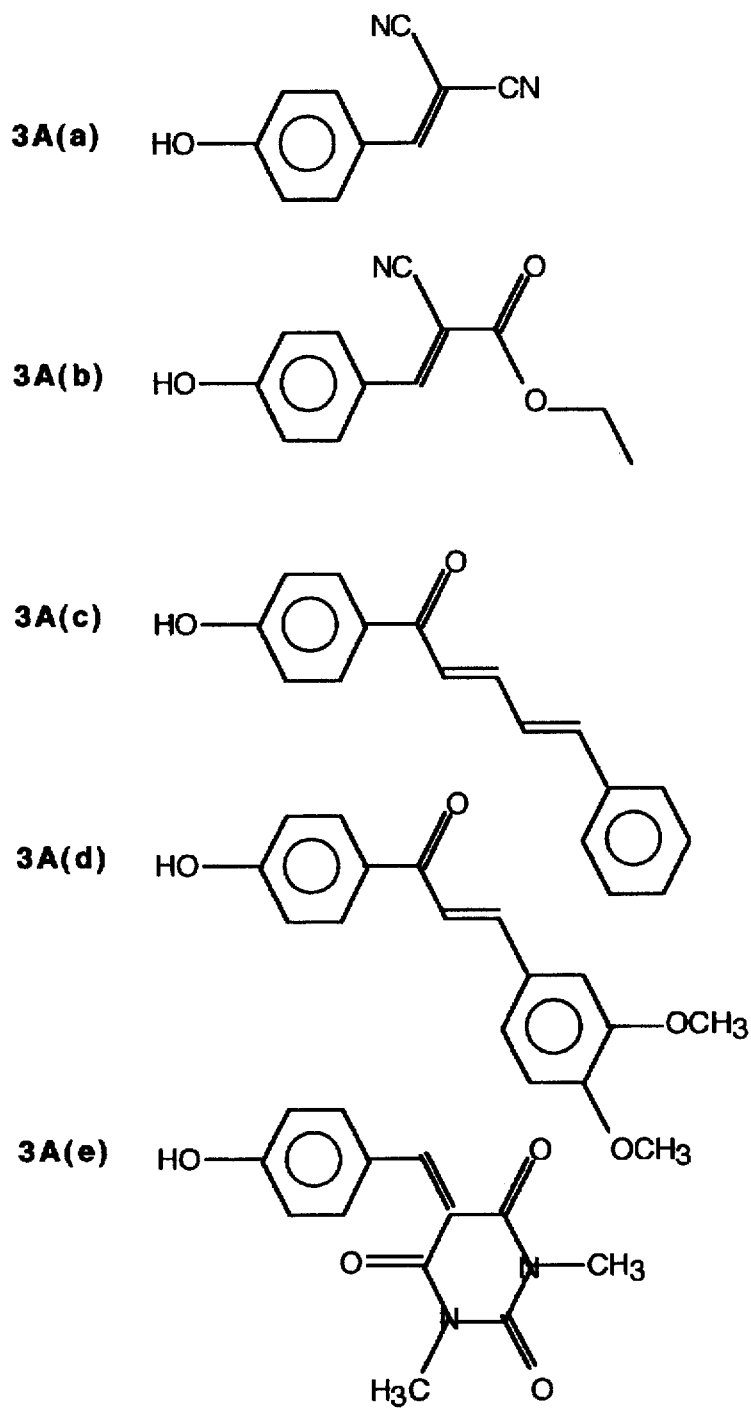
Figure 3A. Preferred Epoxy Resin Graft Substituents for I-Line Anti-Reflective Coating Applications 3B(a) 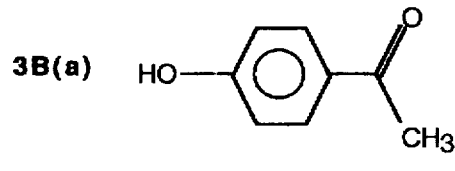
3B(g) 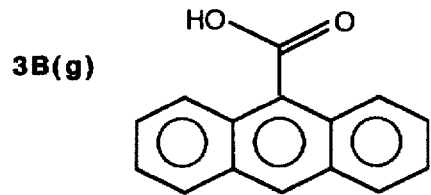
3B(b) 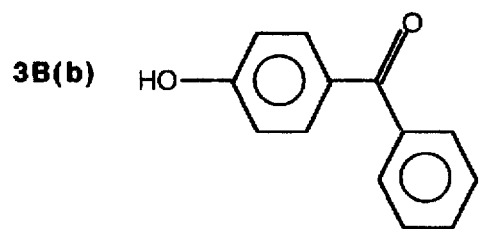
3B(h) 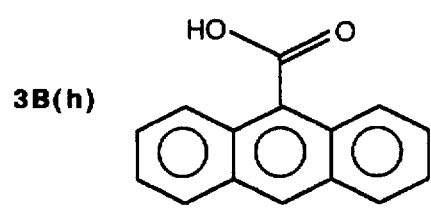
3B(c) 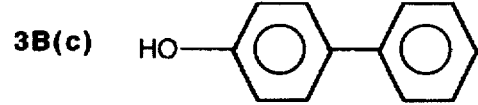
3B(d) 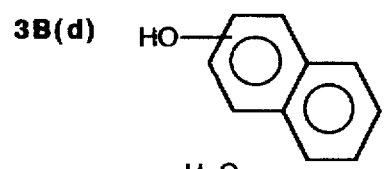
3B(i) 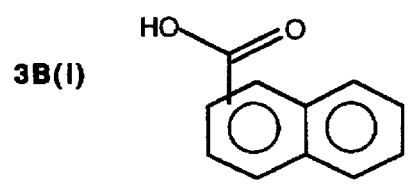
3B(e) 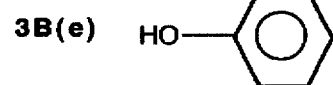
3B(f) 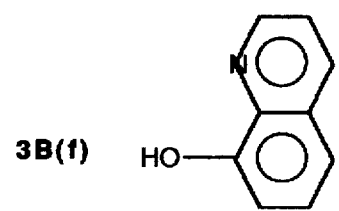
Figure 3B. Preferred Epoxy Resin Graft Substituents for Deep Ultraviolet Anti-Reflective Coating Applications

THERMOSETTING ANTI-REFLECTIVE COATINGS COMPOSITIONS

BACKGROUND OF THE INVENTION

1. Field of the Invention

The present invention relates to bottom layer anti-reflective compositions for multilayer photoresist systems, and particularly thermosetting resins employed in such anti-reflective compositions.

2. Background of the Prior Art

Bottom layer anti-reflective coating compositions ("ARCs") for use in multilayer photoresist systems typically contain high molecular weight thermoplastic binders such as polysulfones and polyimides with high differential solubility, to avoid intermixing with the top layer photoresist. These thermoplastic bound ARCs necessarily use solvents such as N-methylpyrrolidone (NMP), gamma-butyrolactone and THFA (tetrahydrofurfuryl alcohol), which are hygroscopic, have high surface tensions and exhibit low volatility. While these properties may aid differential solubility, there are drawbacks. That is, a variety of film defects such as dimpling, dewetting, voiding, bubbling, and thickness variations can result from the use of low volatility solvents.

With the trend toward sub-half-micron feature sizes, new inadequacies of thermoplastic ARC binders themselves have also become apparent. The most notable of these is their incomplete resistance to intermixing with photoresists (even when using low volatility solvents). Slight intermixing always occurs producing a small but discernable distortion at the bottom of resist features. Because the feature sizes are so small, even this slight distortion is unacceptable for practical device manufacturing.

In order to overcome these drawbacks, there has arisen a need to develop binders for ARCs from thermosetting polymers coatable from fast-drying solvents so that solvent resistance and coating quality can be improved. Two component thermosetting polymer systems such as hydroxyl-functional resins used in conjunction with aminoplast crosslinking agents (hereinafter referred to as HA coatings) are known to be soluble in highly volatile organic solvents and have been used in a wide range of conventional industrial coatings, including modern photoresist compositions. They, therefore, represent highly desirable alternatives to thermoplastic, high molecular weight polymer binders.

However, until now, HA coatings have been characterized by properties which inhibit their use in bottom layer ARCs, e.g., (1) insufficient optical density in ultra thin films; (2) poor photoresist-solvent resistance; (3) storage instability in catalyzed form; (4) commercially unfeasible synthesis techniques for linking chromophores; and (5) inherently restrictive deep ultraviolet absorption, so as to be nonfunctional for g-line and I-line.

In the past, HA coatings, when employed in microlithographic compositions, have been employed primarily as single layer photoresist. These photoresist contain photoacid generators which delay acid-catalyzed crosslinking until exposure to light. Although such delayed catalysis is advantageous in stabilizing a top layer HA coating against gelation during storage, the delay is a drawback to the use of HA coatings as bottom-layer ARCs. That is, since bottom-layer ARCs are not exposed to light until after a layer of photoresist is overcoated onto the ARC, a bottom-layer ARC made from HA coatings must a fortiori cure and gel from an active catalyst prior to exposure or risk nonadherence to the substrate.

Also, the prior art HA compositions provide little, if any, ultraviolet light absorption.

Examples of the above-described prior art HA-compositions are disclosed in U.S. Pat. Nos. 4,341,859; 4,478,932; 4,518,676; 4,734,444; 5,034,304; and 5,376,504.

U.S. Pat. Nos. 3,744,904 and 4,149,888 do disclose photomasks made by physically admixing (without reacting) HA coatings and ultraviolet light absorbers such as azo/diazonium coupling products. However, such coatings are still incapable of imparting the degree of optical density or the level of ultraviolet light absorption required at typical ARC thicknesses, i.e., about 500–2500 Å. Such coatings could be more heavily dye-loaded to increase their optical density but this would prevent the requisite solvent resistance needed to inhibit intermixing with the top photoresist layers once the photoresist is applied over the ARC and baked at typically 90°–140° C.

European patent application 0636941 does disclose a deep ultraviolet thermosetting ARC, but its synthesis is unfeasibly complex, requiring retention of a poly(epoxide) molecular form throughout synthesis, and their reactivity is restricted to deep ultraviolet chromophores. The crosslinking agents are polyfunctional phenolic compounds having a substituted anthracene moiety as the structural center. Although functional under ideal conditions, these ARCs have limited commercial applicability for several reasons. First, preparation of the phenolic/anthracine crosslinking agents involves many steps, including chromatographic purifications of intermediates, making the compounds unrealistically expensive to produce. Secondly, the optical densities of the coating products are low in comparison to the values of 7–15/micron generally accepted as necessary for advanced deep UV lithography (See, J. Sturdevant M. Chaara, R. Elliot, L. Hollifield, R. Soper, D. Stark, N. Thane, J. Petersen, "Antireflection Coating Process Characterization and Improvement for DUV Lithography at 0.25 µm,", SPIE Proceedings: 1995 International Microlithography Symposium, Feb. 19–24, 1995.) The film transmissivity data provided for 1000 Å-thick coatings prepared in Examples 1 and 2 of E.P. 0636941, for example, correspond to optical densities (at deep U.V. 248 nm) of only 6.8/micron and 3.1/micron, respectively. While it is likely that the optical density of the coatings could be improved by increasing the ratio of the crosslinking agent to the epoxy resin in the compositions, such formulation would risk reducing resist compatibility (i.e., increase intermixing). Furthermore, because the crosslinking agents are largely comprised of aromatic and polycyclic aromatic compounds, increasing their concentration would reduce the etch rate of the ARC relative to the photoresist, leading to negative etch biasing and loss of dimensional control.

It is therefore a principal object of the present invention to provide a novel thermosetting ARC and method for making which negates the drawbacks of the prior art.

It is a particular object of this invention to provide a high optical density ARC, resistant to photoresist intermixture at ultra-thin layer thicknesses.

It is an additional object of the present invention to provide a method for making improved thermosetting ARCs for a broad range of exposure wavelengths including deep ultraviolet, I-line and g-line.

It is also an object of the present invention to provide an improved HA coating for use as a bottom-layer ARC which can be stably stored in solution, yet with an active catalyst, so as to crosslink after removed from storage but prior to light exposure.

BRIEF DESCRIPTION OF THE DRAWINGS

FIG. 1 is a reaction scheme for preparing dye-grafted hydroxyl-functional oligomers starting from epoxy novolac resin.

FIG. 2 is a curing scheme for ARCs comprising a dye-grafted hydroxyl-functional oligomer and a methylated melamine-formaldehyde aminoplast crosslinker.

FIG. 3A depicts formulas of epoxy resin graft substituents for I-line ARC applications.

FIG. 3B depicts formulas of epoxy resin graft substituents for deep ultraviolet ARC applications.

(ten), and more specifically include bisphenol A—epichlorohydrin resin products, epoxy novolacs, o-cresol epoxy novolacs, other polyglycidyl ethers, polyglycidylamines, cycloaliphatic epoxides, and polyglycidyl esters. Epoxy resins with functionalities greater than or equal to 2.0 (two) are required; however, resins with functionalities greater than three are preferred. Within the latter group, epoxy novolacs and o-cresol epoxy novolacs with functionalities greater than 3.5 are especially preferred. Examples of acceptable epoxy resin starting materials within each class described above are as follows:

| RESIN CLASS | COMMERCIAL PRODUCTS* | PRODUCT CHEMISTRY |
|---|---|---|
| *bisphenol A/epichlorohydrin | EPON ® 828, DER ® 331 | |
| *glycidylamine type | EPICLON ® 430 | tetraglycidyl methylenedianiline |
| *epoxy novolacs | DEN ® 438 | |
| *o-cresol epoxy novolacs | EPON ® Resin 164 | |
| cycloaliphatic epoxides | Union Carbide ERL 4299 | bis(3,4-epoxycyclohexyl adipate) |
| *polyglycidyl ethers | ALRALDITE ® PT-810 | triglycidyl ether of pentaerithritol triglycidyl isocyanurate |
| polyglycidyl esters | | diglycidyl 1,2-cyclohexanedicarboxylate |

*EPON ® is the trademark of Shell Chemical Company; DER ® and DEN ® are the trademarks of Dow Chemical Company; ARALDITE ® is the trademark of Ciba-Geigy Corporation; and EPICLON ® is the trademark of Dainppon Ink & Chemicals, Inc.

DETAILED DESCRIPTION AND PREFERRED EMBODIMENTS

The thermosetting HA ARCs of the present invention generally comprise dye-grafted, hydroxyl-functional oligomeric binders in conjunction with aminoplast crosslinking agents in a fast-drying, alcohol solvent system containing active acid catalyst. The compositions preferably comprise:

a) a dye-grafted hydroxyl-functional oligomer reaction product of a preselected phenolic-, or carboxylic acid-functional dye and a poly(epoxide) resin, said resin having an epoxy functionality greater than 2.0 (two) and less than 10.0 (ten), the resulting product having effective ARC light absorbing properties;

b) an alkylated aminoplast crosslinking agent derived from melamine, urea, benzoguanamine or glycoluril;

c) a protonic acid catalyst (for curing) with a formula weight preferably greater than 80 g/mole; and d) a low-to-medium boiling (70°–180° C.) alcohol-containing solvent system comprising at least 20% by weight alcohol and a molar ratio of alcohol per equivalent methylol unit of the aminoplast of at least 4:1.

An attribute of the composition is that the poly(epoxide) molecular form is not retained throughout synthesis, but, rather, it forms stable ether or ester linkages when reacted with the dyes.

Effective light absorbing properties, for ARC purposes, requires optical density by spectroscopic reading in the final ARC of at least 3.5/micron film thickness at g-line exposure, preferably at least 5.0/micron, at I-line exposure wavelength, and preferably at least 7/micron at deep ultraviolet.

The composition cures by thermosetting action within microlithographic bake cycles of 30 to 120 seconds.

Starting Materials

1. Epoxy resins

Suitable epoxy resin starting materials include poly (epoxide) resins with epoxy functionalities less than 10

2. Epoxy resin graft substituents

Suitable epoxy resin graft substituents comprise phenolic- and carboxylic acid-functional dyes which when reacted with the epoxide groups of the resin form stable ether or ester linkages, respectively. Monofunctional phenolic and carboxylic acid compounds are preferred to limit crosslinking of the epoxy resin during the grafting reaction. In addition, the grafted phenolic and carboxylic acid compounds together with the other coating components must provide sufficient light absorption to meet the above-stated optical density requirements for ARC materials. This normally means that the graft substituent must exhibit a molar extinction coefficient (expressed in liters/mole-cm) of at least 10000 per 100 g formula weight at the target exposure wavelength.

Preferred graft substituents for g-line applications include phenolic- and carboxylic acid-functional azo dyes suitably derived from azobenzene. Dyes such as 4-dimethylamino-4'-hydroxyazobenzene and 4-dimethylamino-4'-hydroxyazobenzene, for example, are especially useful.

For I-line applications, a variety of phenolic-functional azo, methine, and chalcone dyes can be used as epoxy resin graft substituents. Methine dyes formed by the condensation of 4-hydroxybenzaldehyde or vanillin (4-hydroxy-3-methoxybenzaldehyde) with active methylene compounds such as malononitrile, ethyl cyanoacetate, and N,N'-substituted barbituric acids are especially effective epoxy resin graft substituents for I-line ARCs. Likewise, chalcone dyes resulting from the condensation of (3- or) 4-hydroxyacetophenone with aldehydes such as 4-methoxybenzaldehyde, 3,4-dimethoxybenzaldehyde, and cinnamaldehyde are very useful graft substituents. Example dye structures are shown in FIG. 3A. Of these 4-hydroxy-$\beta,\beta$-dicyanostyrene (FIG. 3A($a$)) is an especially preferred graft substituent for obtaining high absorption at 365 nm.

For deep ultraviolet applications, the hydroxyl-functional acetophenone, benzophenone, biphenyl, napthalene, and quinoline compounds shown in FIG. 3B($a$–$f$) are preferred graft substituents, 2-Hydroxyquinaldine (FIG. 3B(e)) is especially preferred for high absorption at 248 nm. Aromatic polycyclic carboxylic acids (FIG. 3B(g–i), respectively) are also effective graft substituents for achieving strong deep ultraviolet absorptivity. Of these, 9-anthracenecarboxylic acid (FIG. 3B(g)) is especially preferred. It is to be understood that the ARC dyes described above may be chemically modified at various points within their structure, e.g., by chloro substitution on an aromatic ring, while retaining or even improving their useful light-absorbing properties.

3. Acid catalysts

A variety of strong protonic acids can be used as curing catalysts for the thermosetting ARCs. These include, for example, mineral acids, sulfonic acids, oxalic acid, maleic acid, hexamic cyclohexylsulfonic acid, phthalic acid and mixtures thereof. Preferably, the formula weight is above 80 g/mole. Low volatility sulfonic acids, especially para-toluenesulfonic acid, are strongly preferred catalysts for ARC applications because of their high activity and compatibility with polymer resins.

4. Aminoplast crosslinkers

Suitable aminoplast crosslinkers include melamine-formaldehyde resins, benzoguanamine-formaldehyde resins, glycoluril-formaldehyde resins, and urea-formaldehyde resins. The use of these resins in highly alkylated forms, i.e., methylated and/or butylated, are preferred for obtaining long storage life, about three to twelve months, under catalyzed conditions. Highly methylated melamine-formaldehyde resins such as American Cyanamid Company's CYMEL® 300 or CYMEL® 303(LF) resins, which exhibit degrees of polymerization less than two, are especially preferred for obtaining coatings with good storage stability, fast-curing characteristics, and high solvent resistance.

5. Solvents and Additives

Suitable solvents include low-to-medium boiling (70°–180° C.) alcohols, esters, glymes and ethers, cyclic ketones, and their admixtures. Alcohols preferably comprise at least 20 wt % of the ARC solvent system, and the molar ratio of alcohol per equivalent methylol unit of the aminoplast is preferably at least four to one (4:1), and more preferably ten to one (10:1). Examples of suitable solvents by class include:

| Solvent Class | Examples |
| --- | --- |
| alcohols | isopropanol, n-butanol, ethyl lactate, 1-methoxy-2-propanol (PM), 2-methoxyethanol, 2-ethoxyethanol |
| ketones | cyclohexanone, cyclopentanone |
| esters | PM acetate, ethyl 3-ethoxypropionate, methyl 3-methoxypropionate, cellosolve acetate |
| glymes/ethers | diglyme (bis(2-methoxyethyl)ether); dipropylene glycol dimethyl ether; anisole |

Solvents systems comprising ≧70 wt. % 1-methoxy-2-propanol are especially desirable for obtaining good spin coating quality and long shelf life. The coatings may be amended with small amounts (up to 20 wt. % of total solvents) of conventional high boiling ARC solvents such as N-methylpyrrolidone and tetrahydrofurfuryl alcohol to improve the solubility of the dye-grafted oligomeric binders provided the solvents do not cause coating quality or resist incompatibility problems. Flow control agents such as fluorosurfactants, e.g., 3M Company's FLUORAD FC-171 or FC-430, may be added to the coating solutions at levels of 50–1000 ppm (based on solution weight) to improve coating uniformity over substrate topography and reduce resist-ARC interfilm wetting defects. Likewise, organosilane adhesion promoters such as glycidoxypropyl triethoxysilane may be added at levels of 0.01–0.15 weight percent (based on solution weight) to improve the adhesion of the ARC to semiconductor substrates.

Method of Preparation

In preparing the HA ARCs of the present invention, a mere two-step process is employed. In the first step, a poly(epoxide) resin such as that described above is reacted with one of the above phenolic- or carboxylic acid-functional dyes to form an oligomeric dye-grafted binder. This is in contrast to other known, but more cumbersome, synthesis where the poly(epoxide) is reacted with a chemically complex crosslinking agent requiring multi-step synthesis. The reaction scheme is depicted in FIG. 1 using an epoxy novolac resin as the poly(epoxide) starting material. The epoxy novolac and the dye are combined in approximate stoichiometric amounts and heated at from about 100° to about 200° C. under nitrogen cover in the presence of a grafting catalyst to bring about the grafting reaction. A variety of catalysts may be used, but two types are preferred: 1) tetramethylammonium salts such as chloride or hydroxide and 2) tertiary amines, particularly imidazole compounds. The grafting reaction can normally be carried out in the ARC formulation solvent. The reaction product is preferably left in solution.

In the second step, the solution of the oligomeric dye-grafted binder is combined with the aminoplast, acid catalyst, and other additives such as surfactants and diluted to the desired total solids concentration. The order of addition is generally not critical to performance. A total solids level of 3–10 weight percent is typically needed in the ARC solution for achieving the desired 500–2500 Å film thicknesses when the solution is spin coated at 1500–5000 rpm for 30–90 seconds and then cured by baking.

Preferred Coating Compositions

Preferred compositional ranges for dye-grafted oligomeric binder, aminoplast crosslinking agent, and acid catalyst are as follows (based on total resin solids in the ARC solution):

| | Weight percent of Coating Solids | |
| --- | --- | --- |
| Component | Useful Range | Especially Preferred |
| dye-grafted oligomeric binder | 50–90 | 60–85 |
| aminoplast crosslinking agent | 10–50 | 15–35 |
| acid catalyst | 0.1–10 | 2–5 |

When combined in these proportions, the HA anti-reflective coatings demonstrate excellent resist compatibility, i.e., no intermixing, good room temperature storage stability, and rapid curing characteristics at bake temperatures between 150°–200° C.

Method of Use

The new thermosetting ARC compositions can be used satisfactorily on all semiconductor substrates including crystalline and polycrystalline silicon, silicon dioxide, silicon (oxy)nitride, aluminum, aluminum/silicon alloys, and tungsten. The ARCs are applied by spin coating at 1000–6000 rpm for 30–90 seconds. Spinning speeds of 1500–3500 rpm are especially preferred for obtaining uniform, defect-free coatings on the 6" and 8" substrates commonly used in semiconductor manufacture. After spin coating, the ARC is baked at 120°–220° C. for 30–120 seconds on a hot plate or equivalent baking unit. Bake temperatures of 150°–200° C. and bake times of 60–90 seconds are especially effective for achieving high solvent resistance. The curing reactions of the ARCs are depicted schematically in FIG. 2.

A photoresist is applied over the cured ARC by spin coating and then soft baked, exposed, and developed to create the desired masking pattern. An optional post-exposure bake may be applied to the resist prior to development. The resist pattern is then transferred into the ARC layer by reactive ion etching (also known as dry etching or plasma etching) using various gases or gas mixtures which are known in the microlithographic art to be effective for etching organic materials, e.g., $O_2$, $Cl_2$, $CF_4$, $HCF_3$, $SF_6$, their admixtures with $N_2$, Ar, He, etc. After the ARC layer has been etched, the semiconductor substrate can be selectively etched, implanted, or deposited on through the pattern formed in the resist and ARC. When these steps have been completed, the resist and ARC are removed by plasma etching and/or dissolution in aqueous or nonaqueous stripping chemicals. The stripped substrate is then ready for another application of ARC and/or photoresist to begin a new processing cycle.

EXAMPLE 1

Preparation and Properties of I-line ARC Derived from Dye-grafted Epoxy Novolac Resin a. Preparation of 4-($\beta$,$\beta$-dicyanovinylene)phenoxy-functional oligomer Into a 1-liter, round bottom flask placed in an oil bath and fitted with a magnetic stirring bar, nitrogen inlet, and reflux condenser was charged Dow Chemical's DEN® 438 epoxy novolac resin (68.86 g, average functionality=3.6, epoxide equivalent weight=178.5 g/eq) and 1-methoxy-2-propanol (200 ml). The contents were warmed and stirred under nitrogen to dissolve the epoxy resin in the reaction solvent. After the solution became homogeneous, 4-hydroxybenzaldehyde (4-HBA, 47.11 g, 0.386 moles) was added into the reaction flask along with an additional 80 ml of 1-methoxy-2-propanol. The grafting catalyst, tetramethylammonium hydroxide (5.00 g of 25 wt. % aqueous solution), was added immediately thereafter and washed in with 20 ml of 1-methoxy-2-propanol. The reactor contents were heated to reflux and maintained at that temperature (~120° C.) for four hours. Subsequently, the contents were cooled to room temperature and malononitrile (25.48 g, 0.386 moles) dissolved in 80 ml of 1-methoxy-2-propanol was added to form the I-line active 4-($\beta$,$\beta$-dicyanovinylene) phenoxy chromophores via reaction with the benzaldehyde groups grafted onto the resin. The solution was stirred for ~16 hours at room temperature to complete the condensation reaction and then neutralized by the addition of 3.15 g p-toluenesulfonic acid monohydrate. The theoretical solids level of the dye-grafted oligomer in the solution was 26.9 weight percent.

b. ARC Formulation

An ARC composition was prepared by combining 40.00 g of the above dye-grafted oligomer solution, 2.00 g American Cyanamid's CYMEL® 300 methylated melamine-formaldehyde resin and 0.50 g toluenesulfonic acid monohydrate and diluting the mixture to ~6 wt. % total solids with 1-methoxy-2-propanol.

c. ARC Properties

The ARC was spin coated at 4000 rpm for 60 seconds onto 3" glass rounds and 3" silicon wafers for property evaluations. The specimens were baked on a hot plate for 30 seconds at 100° C. and then at 200° C. for 60 seconds. A stripping test (see below) was then performed with a common photoresist solvent, propylene glycol monomethyl ether acetate, to determine the solvent resistance of the ARC. The stripping results are tabulated in Table A.

Description of Stripping Test

The film thickness and optical absorbance of the antireflective layer are determined using coated silicon and glass substrates, respectively. The specimens are then flooded with photoresist solvent for 5 seconds followed by spin drying at 5000 rpm for 30 seconds and baking on a hot plate at 100° C. for 60 seconds. The film thickness and optical absorbance are then re-determined. If more than a few percent decrease (>5%) in film thickness or optical absorbance results from solvent stripping, the ARC is normally judged to have insufficient solvent resistance for practical usage.

TABLE A

STRIPPING RESULTS FOR EXAMPLE 1 ARC

| SPECIMEN TYPE | FILM THICKNESS (Å) | | | FILM OPTICAL ABSORBANCE (@ 365 NM) | | |
|---|---|---|---|---|---|---|
| | BEFORE | AFTER | % CHANGE | BEFORE | AFTER | % CHANGE |
| ●silicon | 1446 | 1426 | −1.2 | | | |
| ●silicon | 1416 | 1403 | −1.1 | | | |
| ●glass | 1485 | 1527 | +1.2 | 0.798 | 0.818 | +2.5 |
| ●glass | | | | 0.774 | 0.773 | +0.1 |

The responses of film thickness and absorbance to stripping were acceptably low indicating that the ARC had excellent solvent resistance properties. Likewise, the optical density of the coating (5.4/micron) exceeded the target requirement of 5/micron for I-line applications.

EXAMPLE 2

ARC Room Temperature Storage Stability

The ARC composition from Example 1 was placed at room temperature and sampled periodically to ascertain the stability of coating thickness, absorbance, and solvent resistance (as measured by stripping) over time. The same coating and baking conditions described in Example 1 were used to apply the coating. The storage stability results are shown in Table B. While the results showed some small fluctuations because of the natural variability of the test methods, the only observable property changes over the 16-week period were a slight decrease in film thickness and a slight increase in film absorbance, both of which were acceptable from a usage standpoint.

TABLE B

ROOM TEMPERATURE STORAGE STABILITY RESULTS FOR EXAMPLE 1 ARC

| STORAGE TIME (WKS) | FILM THICKNESS(Å) | % CHANGE FROM INITIAL | FILM ABSORBANCE | % CHANGE FROM INITIAL | STRIPPING(%)* THICKNESS | STRIPPING(%)* ABSORBANCE |
|---|---|---|---|---|---|---|
| initial | 1273 | — | 0.767 | — | −0.8 | 0 |
| 2 | 1252 | −1.7 | 0.787 | +2.6 | −0.8 | −0.5 |
| 4 | 1253 | −1.6 | 0.773 | +0.8 | −0.4 | +0.4 |
| 6 | 1238 | −2.8 | 0.773 | +0.8 | −0.6 | 0 |
| 8 | 1239 | −2.7 | 0.795 | +3.7 | −0.6 | — |
| 12 | 1234 | −3.1 | 0.787 | +2.6 | −0.6 | −0.7 |
| 16 | 1242 | −2.4 | 0.782 | +2.0 | — | — |

*REFERS TO PERCENT CHANGE FROM PRE-STRIP FILM THICKNESS AND ABSORBANCE MEASUREMENT.

EXAMPLE 3

Preparation and Properties of I-Line ARC Derived from Dye-grafted o-Cresol Epoxy Novolac Resin a. Preparation of 4-($\beta,\beta$-dicyanovinylene)phenoxy-functional oligomer Into a 250 ml, round bottom flask fitted with a heating mantle, magnetic stirring bar, nitrogen inlet, and reflux condenser was charged Shell Chemical's EPON® 164 o-cresol epoxy novolac resin (22.55 g, average functionality=5, epoxide equivalent weight=220 g/eg), 4-hydroxybenzaldehyde (4-HBA, 12.52 g, 0.103 moles), and 1-methoxy-2-propanol (60 ml). The contents were warmed and stirred under nitrogen to dissolve the epoxy resin and 4-HBA in the reaction solvent. After the solution became homogeneous, the grafting catalyst, tetramethylammonium hydroxide (2.00 g of 25 wt % aqueous solution), was washed in with 10 ml of 1-methoxy-2-propanol. The reactor contents were then heated to reflux and maintained at that temperature (~120° C.) for four hours. Subsequently, the contents were cooled to room temperature and malononitrile (677 g, 0.103 moles) dissolved in 30 ml of 1-methoxy-2-propanol was added to form the I-line active 4-($\beta,\beta$-dicyanovinylene)phenoxy chromophores through reaction with the benzaldehyde groups grafted onto the resin. The solution was stirred for ~16 hours at room temperature to complete the condensation reaction and then neutralized by the addition of 1.25 g p-toluenesulfonic acid monohydrate. The theoretical dye-grafted oligomer solids level in the reaction mixture was 29.1 weight percent.

b. ARC Formulation

An ARC composition was prepared by combining 40.00 g of the above dye-grafted oligomer solution, 3.23 g American Cyanamid's CYMEL® 303LF methylated melamine-formaldehyde resin and 0.30 g toluenesulfonic acid monohydrate and diluting the mixture to ~6 wt. % total solids with 1-methoxy-2-propanol.

c. ARC Properties

The ARC was spin coated at 4000 rpm for 60 seconds onto 3" glass rounds and 3" silicon wafers for property evaluations. The specimens were baked on a hot plate for 60 seconds at 175° C. Film absorbance at 365 nm and film thickness before and after stripping with photoresist solvent (ethyl lactate) were then determined as a measure of ARC optical density and solvent resistance. The ARC was also subjected to an interlayer test (see below) to determine its propensity for intermixing with photoresist. The results are summarized in Table C. The responses of film thickness and absorbance to ethyl lactate stripping were very low indicating that the ARC had excellent solvent resistance properties. The interlayer value was less than 3% indicating a desirably low potential for resist intermixing.

TABLE C

STRIPPING AND INTERLAYER TESTING RESULTS FOR EXAMPLE 3 ARC

| SPECIMEN TYPE | STRIPPING FILM THICKNESS (Å) BEFORE | STRIPPING FILM THICKNESS (Å) AFTER | STRIPPING FILM THICKNESS (Å) % CHANGE | STRIPPING FILM OPTICAL ABSORBANCE BEFORE | STRIPPING FILM OPTICAL ABSORBANCE AFTER | STRIPPING FILM OPTICAL ABSORBANCE % CHANGE | INTERLAYER FILM THICKNESS (Å) BEFORE | INTERLAYER FILM THICKNESS (Å) AFTER | INTERLAYER FILM THICKNESS (Å) % CHANGE |
|---|---|---|---|---|---|---|---|---|---|
| ●silicon (average of 2 specimens) | 1912 | 1908 | −0.2 | | | | | | |
| ●glass (average of 2 specimens) | 1910 | | | 0.939 | 0.943 | −0.4 | | | |
| ●silicon | | | | | | | 1898 | 1937 | +2.1 |

Description of Interlayer Test

For I-line ARC compositions, the interlayer test is generally conducted as follows. After coating and baking, the ARC thickness is determined by ellipsometry. Next, a one-micron thick layer of high resolution I-line photoresist such as Japan Synthetic Rubber's IX500EL is spin coated over the ARC. The photoresist is then soft baked on a hot plate at 100° C., flood exposed on a contact printer to ensure over-exposure, and post-exposure baked on a hot plate for 60 seconds at 120° C. The specimen is then developed in Shipley's MF®-319 photoresist developer for 60 seconds to clear the exposed photoresist. After drying the specimen with nitrogen, the thickness of the ARC layer is re-determined. If significant mixing of the ARC and resist has occurred, the ARC layer will show an apparent increase in thickness, which is normally expressed as a percentage of the starting ARC thickness. ARCs which are highly subject to intermixing will show more than a 10% increase in thickness after resist processing. An interlayer value of less than 5% is considered acceptable (assuming a starting ARC thickness of 1000–2000 Å); a value less than 3% is considered excellent.

EXAMPLE 4

Preparation and Properties of Higher Melamine-Formaldehyde Content I-line ARC Derived from Dye-grafted Epoxy Novolac Resin An I-line ARC composition was prepared by combining the dye-grafted oligomer prepared in Example 1 with CYMEL 303LF methylated

| Component | Weight Percent in ARC Solution |
|---|---|
| ●dye-grafted aligomer solution from Example 1 (26.9 wt. % oligomer solids) | 14.08 |
| ●CYMEL 303LF | 2.13 |
| ●P-toluenesulfonic acid monohydrate | 0.11 |
| ●1-methoxy-2-propanol | 83.68 |

The ARC was spin coated at 4000 rpm for 60 seconds onto 3" glass rounds and 3" silicon wafers for property evaluations. The specimens were baked on a hot plate for 60 seconds at 135°–200° C. after which an ethyl lactate stripping test and an interlayer test were performed, the results of which are summarized in Table D. The stripping responses were very good. The interlayer responses were below 3% at all temperatures indicating that the ARC had excellent solvent resistance properties with broad bake temperature latitude.

mask with equal line-space features ranging in pitch from 0.4–2.0 µm. After exposure, the wafer specimens were baked at 110° C. in proximity for 120 seconds (40 seconds on each of three in-line hot plates) and then single-puddle developed in TOK's NMDW developer for 60 seconds to clear the features.

Resists Included in Test
TOK IP3300
TOK IP3500
Mitsubishi 8200 14N
Mitsubishi 8100 16N
Sumitomo PFR-38A
JSR IX500EL The patterned resist-over-ARC specimens were cross-sectioned for examination by scanning electron microscopy to determine the quality of the 0.35 µm line features. In all cases, the feature sidewall angle of the features was greater than 85° and the sidewall was straight, i.e., no curvature or bulging (footing) was observed at the bottom of the features which would be indicative of resist-ARC intermixing. Resist features patterned directly on the silicon substrate showed strong standing wave patterns as evidenced by the presence of sharp periodic indentations in the sidewalls of the features. When the ARC was present, on the other hand, the standing wave pattern was greatly suppressed.

EXAMPLE 6

Preparation and Properties of Deep Ultraviolet ARC Derived from Epoxy Novolac Resin and 9-Anthracenecarboxylic Acid a. Addition of 9-anthracenecarboxylic acid to epoxy novolac resin to form dye-grafted oligomer A 250 ml three-necked flask equipped with nitrogen inlet, magnetic stirring bar, thermometer, and condenser with nitrogen outlet was charged with 3.24 g (18.2 mmol) of DEN® 438 epoxy novolac resin, 4.00 g (18.0 mmol) of 9-anthracenecarboxylic acid, 40.85 g of cyclohexanone, and

TABLE D

| | STRIPPING AND INTERLAYER TESTING RESULTS FOR EXAMPLE 4 ARC | | | | | | | | |
|---|---|---|---|---|---|---|---|---|---|
| SPECIMEN | BAKE | STRIPPING FILM THICKNESS(Å) | | | STRIPPING FILM OPTICAL ABSORBANCE | | | INTERLAYER FILM THICKNESS (Å) | | |
| TYPE* | TEMPERATURES(°C.) | BEFORE | AFTER | % CHANGE | BEFORE | AFTER | % CHANGE | BEFORE | AFTER | % CHANGE |
| ●SILICON | 175 | 1203 | 1200 | –0.2 | | | | | | |
| ●GLASS | 175 | 1057 | | | 0.585 | 0.583 | –0.3 | | | |
| ●SILICON | 135 | | | | | | | 1186 | 1210 | +2.0 |
| ●SILICON | 150 | | | | | | | 1179 | 1206 | +2.3 |
| ●SILICON | 175 | | | | | | | 1129 | 1154 | +2.3 |
| ●SILICON | 200 | | | | | | | 1105 | 1137 | +2.9 |

(*AVERAGE FOR 2 SPECIMENS)

EXAMPLE 5

Microlithographic Performance of Example 4 I-line ARC

The Example 4 I-line ARC composition was spin coated onto 6" silicon substrates at 2800 rpm for 60 seconds and then hot plate baked at 175° C. for 60 seconds to obtain defect-free films with a nominal thickness of 1165 Å. A variety of high resolution I-line photoresists (see below) were then applied over the candidate ARC to a thickness of ~1 micron. The resist-coated specimens were soft baked at 90° C. in proximity for 120 seconds (40 seconds on each of three in-line hot plates) and then exposed on a Cannon 2000I I-line stepper with NA=0.52 and sigma=0.5 using a test 0.20 g (0.88 mmol) of benzyltriethylammonium chloride. The reaction mixture was stirred under nitrogen at 96°–102° C. for 16 hours giving a dark solution of dye-grafted oligomer. The nitrogen flow was shut off after a short time and the nitrogen outlet replaced with an anhydrous magnesium sulfate drying tube.

The above reaction solution (4.0 g) was added to 6.0 g of 1-methoxy-2-propanol and the resulting solution filtered through a 0.2 µm end-point. The dye-attached polymer solution was spin coated onto quartz slides at 4000 rpm for 60 seconds, hot plate baked in full contact at 100° for 30 seconds and then at 205° C. for 60 seconds. Coating quality was good and film absorbance at 248 nm was 1.376 at 1000 Å thickness.

b. ARC Formulation

A deep ultraviolet-active ARC was formulated by mixing 12.3 g (15.4% solids) of the above reaction solution, 1.06 g of CYMEL 303LF methylated melamine-formaldehyde resin, 0.055 g of p-toluenesulfonic acid monohydrate, and 36.60 g of 1-methoxy-2-propanol.

c. ARC Properties

The above ARC was spin coated at 4000 rpm for 60 seconds and cured at 175° C. for 60 seconds with vacuum. Coating quality was good to excellent and film absorbance at 248 nm was 1.09 per 1000 Å thickness. Ethyl lactate stripping resulted in film thickness and film optical absorbance losses of less than 0.5% for a starting film thickness of 1205 Å. An interlayer test using OCG's CAMP® VI deep ultraviolet photoresist was also conducted on the candidate ARC. The resist was spin coated at 4000 rpm for 40 seconds and hot plate baked at 105° C. for 60 seconds. Following blanket exposure on a contact printer and post-exposure baking at 115° C. for 60 seconds, the specimen was developed in Shipley MF®-319 for 60 seconds and then rinsed and dried. As a result of resist processing, a 2.86% increase in ARC thickness was observed indicating the ARC had excellent resistance to intermixing with the resist.

After thirty-one days at room temperature, the ARC was spin coated at 4000 rpm for 60 seconds and cured as above. Coating quality was very good. Comparison to initial values showed that film thickness had decreased only slightly (2.6%) while absolute film optical absorbance increased by 2.8%, both values indicating excellent storage stability.

EXAMPLE 7

Preparation and Properties of Deep Ultraviolet ARC Derived from Epoxy Novolac Resin and 9-Acridinecarboxylic Acid a. Addition of 9-acridinecarboxylic acid to epoxy novolac to form dye-grafted oligomer A 100 ml round-bottomed flask equipped with magnetic stirring bar and condenser with anhydrous magnesium sulfate drying tube was charged with 0.90 g (4.03 mmol) of 9-acridinecarboxylic acid hydrate, 0.72 g (4.03 nmol) of DEN 438 epoxy novolac resin, 9.19 g of cyclohexanone, and 33.9 mg (0.15 mmol) of benzyltriethylammonium chloride. At an initial reaction mixture temperature of 95° C. solution did not occur, so 9.2 g of cyclohexanone was added. The reaction mixture was then stirred at 135°-137° C. for 20 hours to form the dye-grafted oligomer solution. The total solids level of the final solution was 8.25 weight percent.

About 2.0 g of 1-methoxy-2-propanol was added to the above cyclohexanone reaction solution (6.0 g), followed by stirring. The coating was filtered through a 0.2 μm end-point filter and spin coated onto a quartz slide at 5000 rpm for 60 seconds followed by a full-contact hot plate bake at 175° C. for 60 seconds. Film optical absorbance was 1.238 at 1000 Å.

b. ARC Formulation

An ARC was formulated by mixing 10.0 g (8.25% solids) of the above acridine dye-attached oligomer solution, 0.464 g of CYMEL 303LF methylated melamine-formaldehyde resin, 23 mg of p-toluenesulfonic acid monohydrate, 5.88 g of cyclohexanone, and 5.49 g of 1-methoxy-2-propanol to solution.

c. ARC Properties

The above ARC was spin coated onto silicon and quartz substrates at 5000 rpm for 60 seconds and hot plate cured at 175° C. for 60 seconds. Film absorbance at 248 nm was 1.12 at 1000 Å thickness. An ethyl lactate stripping test performed on an 841 Å thick ARC resulted in a film thickness loss of only 0.7% and an optical absorbance increase of 1.3%, both figures being very acceptable.

EXAMPLE 8

Preparation and Properties of Deep Ultraviolet ARC Derived from Epoxy Novolac Resin and 2-Napthoic Acid a. Addition of 2-napthoic acid to epoxy novolac to form dye-grafted oligomer A 250 ml three-necked flask equipped with magnetic stirring bar, nitrogen inlet, thermometer, and condenser with nitrogen outlet was charged with 5.02 g (28.1 mmol) of DEN 438 epoxy novolac resin, 4.84 g (28.1 mmol) of 2-naphthoic acid, 55.8 g of cyclohexanone, and, lastly, 0.31 g (1.36 mmol) of benzyltriethylammonium chloride. The reaction, under nitrogen, was stirred at 92°–100° C. for 49 hours giving the dye-attached oligomer solution. The total solids level of the final solution was 15.4 weight percent.

b. ARC Formulation

A thermosetting ARC formulation was prepared from 12.3 g (15.4% solids) of the above oligomer solution, 1.06 g of CYMEL 303LF methylated melamine-formaldehyde resin, 55 mg of p-toluenesulfonic acid monohydrate, and 36.60 g of 1-methoxy-2-propanol.

c. ARC Properties

The above ARC was spin coated onto silicon and quartz substrates at 4000 rpm for 60 seconds and hot plate cured at 175° C. for 60 seconds. Coating quality was good. Film absorbance at 248 nm was 0.88 at 1000 Å thickness. Ethyl lactate stripping caused a film thickness loss of only 0.35% while film optical absorbance increased by 1.61%.

EXAMPLE 9

Preparation and Properties of Deep Ultraviolet ARC Derived from Epoxy Novolac Resin and 8-Hydroxyguinaldine a. Addition of 8-hydroxyquinoline to epoxy novolac to form dye-grafted oligomer Following a preparation analogous to that described in Example 1, a deep ultraviolet active oligomer was prepared by reacting DEN 438 epoxy novolac resin with a stoichiometric amount of 8-hydroxyguinoline in 1-methoxy-2-propanol using tetramethylammonium hydroxide as a catalyst. The theoretical dye-attached oligomer solids level in the solution was 29.2 weight percent.

b. ARC Formulation

A thermosetting ARC formulation was prepared from the above dye-grafted oligomer, CYMEL 303LF methylated melamine-formaldehyde resin, p-toluenesulfonic acid monohydrate, and 1-methoxy-2-propanol by mixing them in the following proportions:

| Component | Weight Percent in ARC Solution |
| --- | --- |
| ●dye-grafted oligomer solution | 14.88 |
| ●CYMEL 303LF | 1.65 |
| ●p-toluenesulfonic acid monohydrate | 0.11 |
| ●1-methoxy-2-propanol | 83.68 | c. ARC Properties

The above ARC was spin coated onto silicon and quartz substrates at 4000 rpm for 60 seconds and then hot plate baked at 205° C. for 60 seconds. Coating quality was good. Film absorbance at 248 nm was 0.87 at 1000 Å thickness.

Ethyl lactate stripping produced no film thickness or film optical absorbance loss. An interlayer test performed with JSR IX500 photoresist showed a 3.4% ARC thickness increase indicating little or no resist intermixing.

What is claimed is:

1. An improved ARC composition comprising
   a. a dye-grafted hydroxyl-functional oligomer reaction product of
      a preselected phenolic- or carboxylic acid-functional dye and a poly(epoxide) resin, said resin having an epoxy functionality greater than 3.0 and less than 10, said reaction product having light-absorbing properties effective for bottom-layer ARC applications;
   b. an alkylated aminoplast crosslinking agent derived from melamine, urea, benzoguanamine or glycoluril;
   c. a protonic acid curing catalyst;
   d. an alcohol-containing solvent system boiling at 70° to 180° C. wherein the alcohol comprises at least twenty (20) weight percent of the total solvent content and the molar ratio of alcohol per equivalent methylol unit of the aminoplast is at least four to one (4:1);
   e. having ether or ester linkages derived from the poly (epoxide) molecules; and
   f. the composition having about 50% to 90% dye-grafted hydroxyl-functional oligomer, about 10% to 50% aminoplast crosslinking agent, and about 0.1% to 10% protonic acid catalyst by weight of solids content;
   whereby the improved ARC negates resist/ARC component intermixing, by virtue of the ARCs thermosetting action, provides improved optical density at a broad range of exposure wavelengths and at 500-2500 Å layer thicknesses, and negates the need for high molecular weight thermoplastic ARC binders.

2. The composition of claim 1 wherein the protonic acid catalyst has a formula weight greater than 80 g/mole.

3. The composition of claim 1 wherein the poly(epoxide) resins are selected from the group consisting of bisphenol A-epichlorohydrin resins, epoxy novolacs, o-cresol epoxy novolacs, polyglycidyl ethers, polyglycidylamines, cycloaliphatic epoxides, and polyglycidyl esters.

4. The composition of claim 1 wherein the poly(epoxide) resins are epoxy novolacs or o-cresol epoxy novolacs having epoxy functionalities greater than 3.5.

5. The composition of claim 1 wherein the dye has a molar extinction coefficient of at least 10,000 (liters/mole-cm) per 100 g formula weight at deep ultraviolt, g-line or i-line wavelengths.

6. The composition of claim 5 wherein the dye substituent is a g-line absorbing dye and the ARC has an optical density of at least 3.5/micron thickness at g-line exposure.

7. The composition of claim 6 wherein the g-line absorbing dye is selected from the group consisting of phenolic- and carboxylic acid-functional derivatives of azobenzene.

8. The composition of claim 5 wherein the dye is an i-line absorbing dye and the ARC has an optical density of at least 5.0/micron thickness at i-line exposure.

9. The composition of claim 8 wherein the i-line dyes are phenolic-functional dyes selected from the group consisting of azos, methines, and chalcones.

10. The composition of claim 8 wherein the i-line dye is 4-hydroxy-β,β-dicyanostyrene.

11. The composition of claim 5 wherein the dye is a deep ultraviolet absorbing dye and the ARC has an optical density of at least 7.0/micron thickness at deep ultraviolet exposure.

12. The composition of claim 11 wherein the deep ultraviolet dyes are selected from the group consisting of hydroxyl functional acetophenones, benzophenones, biphenyls, naphthalenes and quinolines.

13. The composition of claim 12 wherein the deep ultraviolet dye is 2-hydroxyquinaldine.

14. The composition of claim 11 wherein the deep ultraviolet dyes are aromatic polycyclic carboxylic acids.

15. The composition of claim 14 wherein the deep ultraviolet dye is 9-anthracenecarboxylic acid.

16. The composition of claim 1 wherein the protonic curing acid is selected from the group consisting of mineral, sulfonic, oxalic, maleic, cyclohexylsulfonic acid, phthalic acids, and mixtures thereof.

17. The composition of claim 16 wherein the curing acid catalyst is low volatility p-toluene sulfonic acid.

18. The composition of claim 1 wherein the aminoplast crosslinking agent is a highly alkylated melamine-formaldehyde resin having a degree of polymerization less than 2.0.

19. The composition of claim 1 wherein the alcohol-containing solvent system comprises, in addition to alcohol, a solvent selected from the group consisting of esters, glymes, ethers, cyclic ketones and mixtures thereof.

20. The composition of claim 19 wherein the solvent system comprises ≧70 wt. % 1-methoxy-2-propanol.

21. The composition of claim 19 wherein the solvent system comprises a molar ratio of the alcohol per equivalent methylol unit of the aminoplast of at least 10:1.

22. The composition of claim 1 comprising 60% to 85% dye-grafted hydroxyl-functional oligomer, 15% to 35% aminoplast crosslinking agent, and 2% to 5% protonic acid catalyst by weight of solids content.

* * * * *

UNITED STATES PATENT AND TRADEMARK OFFICE
CERTIFICATE OF CORRECTION

PATENT NO. : 5,693,691
DATED : December 2, 1997
INVENTOR(S) : Tony D. Flaim, Jim D. Meador, Xie Shao, and Terry Lowell Brewer It is certified that error appears in the above-identified patent and that said Letters Patent is hereby corrected as shown below:

Column 5, line 15, delete "hexamic cyclohexylsulfonic acid" and insert -- hexamic cyclohexylsulfamic acid--.
Column 16, claim 16, line 27, delete "cyclohexylsulfonic acid" and insert --cyclohexylsulfamic acid--.

Signed and Sealed this

Third Day of November, 1998

BRUCE LEHMAN

Attest:

Attesting Officer

Commissioner of Patents and Trademarks

UNITED STATES PATENT AND TRADEMARK OFFICE
CERTIFICATE OF CORRECTION

PATENT NO. : 5,693,691

DATED : December 2, 1997

INVENTOR(S) : Flaim et al.

It is certified that error appears in the above-identified patent and that said Letters Patent is hereby corrected as shown below:

Column 5, line 15, delete "hexamic".

Signed and Sealed this

Thirteenth Day of June, 2000

Attest:

Q. TODD DICKINSON

*Attesting Officer*      *Director of Patents and Trademarks*